(12) United States Patent
Bilardi et al.

(10) Patent No.: US 7,107,399 B2
(45) Date of Patent: Sep. 12, 2006

(54) SCALABLE MEMORY

(75) Inventors: Gianfranco Bilardi, Padova (IT); Kattamuri Ekanadham, Mohegan Lake, NY (US); Pratap Chandra Pattnaik, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/854,213

(22) Filed: May 11, 2001

(65) Prior Publication Data
US 2002/0169933 A1 Nov. 14, 2002

(51) Int. Cl.
*G06F 12/00* (2006.01)

(52) U.S. Cl. .................. 711/115; 711/111; 711/172; 711/170

(58) Field of Classification Search ............ 711/116, 711/115, 111, 172, 170
See application file for complete search history.

(56) References Cited

U.S. PATENT DOCUMENTS 5,357,621 A * 10/1994 Cox ........................ 711/172
6,109,929 A * 8/2000 Jasper ...................... 361/790
6,425,064 B1 * 7/2002 Soderquist .................. 711/171

FOREIGN PATENT DOCUMENTS

WO    WO 99/30240 A1 * 6/1999

* cited by examiner

*Primary Examiner*—Donald Sparks
*Assistant Examiner*—Paul Baker
(74) *Attorney, Agent, or Firm*—Douglas W. Cameron (57) ABSTRACT

A memory structure and method for handling memory requests from a processor and for returning correspondence responses to the processor from various levels of the memory structure. The memory levels of the memory structure are interconnected by a forward and return path with the return path having twice the bandwidth of the forward path. An algorithm is used to determine how many responses are sent from each memory level on the return path to the processor. This algorithm is designed to guarantee a constant bound on the rate of responses sent to the processor. More specifically, if a write request is at the same level to which it is targeted, or if a request at a memory level is targeted to a higher memory level, then two responses are forwarded from a controller at the memory level on the return path to the processor. Otherwise, only one response is forwarded from the memory level on the return path.

6 Claims, 6 Drawing Sheets

FIG.1

INVARIANT:
$(X_i = 3) \Rightarrow$ INCOMING LINKS HAVE
AT MOST ONE REQUEST

SCALABLE MEMORY

DESCRIPTION

1. Technical Field

This invention relates to a scalable memory system that supports unbounded pipeline depth under constant bandwidth constraints, where the access time increases only linearly with pipeline depth.

2. Background of the Invention

It is well-known that memory technology does not scale with processor technology, and mismatch of their speeds continues to exist. One of the popular means employed to bridge this gap is to design the memory as a hierarchical pipeline. Memory is organized as a layer of stages or caches. Layers closer to the processor are faster but smaller in size while layers farther from the processor are slower and have larger sizes. The hope is that the latency of transfer of data from remote stages can be hidden by feeding the processor from the closer levels. However, the current designs do not scale well as the memory size grows. Each stage of the memory has a different design and hence the latencies are non-linear and hard to predict. The transfer of data from higher to lower levels is implicitly managed by the memory subsystem, and the processor is unaware of the transfers. The transfers are triggered directly by demand for the data or by hardware speculation of spatial locality. Hence, effective reduction in latency does not take place without substantial increase in bandwidth from different components of the memory.

In view of the above observations, it is desirable to have a scalable memory with the following features:

1. The memory should be composable (to any size) uniformly by adding instances of the same building block
2. The characteristics of the building block (memory level) must be independent of technology, subject only to the laws of physics—i.e., the memory within a block has finite size and speed dictated by the specific technology that is employed; a block is physically separated from another block and communication between two blocks takes finite time based on their distance and on permissible topologies of their layout.
3. The latency of access to a location in memory should be linearly proportional to its distance from the processor.
4. The communication bandwidth required between blocks should be constant regardless of the size of the memory.
5. The memory should be able to accept requests at a constant rate and supply the results at a proportional rate, regardless of the size of the memory.

SUMMARY OF THE INVENTION

It is an object of this invention to provide a memory system wherein the access time to a location in memory is linearly proportional to the memory location's distance from the processor. It is a further object of this invention to provide a linear cost memory where the bandwidth required between different levels of the memory is constant regardless of the number of levels in the memory.

It is another object of this invention to accept requests at a constant input rate and to supply the responses of these requests at a rate which is constant multiple of the input rate.

It is a more general object of this invention to provide a scalable memory which is composable to any size by adding additional memory levels.

Accordingly, this invention provides for a memory structure for processing memory requests. This structure has a number of memory levels, where each level has a memory unit and a first and second memory controller.

A memory request contains an opcode (read or write), a target level and optionally some data. The request carries data only if the operation is a write. A memory response is generated in response to a request for a read operation. There is no response to a write operation. A response has a similar format. It always carries data in the data field.

The memory structure also has a forward path for carrying each memory request to the memory levels, and a return path having at least twice the bandwidth of the forward path. The return path is used for carrying responses, to the memory requests. The first controller makes a copy of each memory request and sends one copy to the memory unit and another copy to a higher level first controller. For a read operation, a memory unit copies data from memory into the memory request. For a write operation, the data from the memory request is copied into the memory. In either case, a copy of the resulting memory request is sent to the second controller at that level. The second controller either discards the memory request or converts it into a memory response and sends the response on the return path to a second controller at a lower level as described below:

a. If a read request is received from a memory unit and it is at the same level as the target level of the request, then the request is converted to a response and is sent to a lower level along with one response, if any, from the internal buffers of the second controller at that level.

b. If a write request is received from a memory unit and it is at the same level as the target level of the request, then the request is discarded and two responses, if any, from the internal buffers of the second controller at that level are forwarded to the second controller at a lower level.

c. If a request is received from a memory unit and it is at a level lower level than the target level of the request, then the request is discarded and two responses, if any, are forwarded to the second controller at a lower level.

d. If a request is received from a memory unit and it is at a level higher level than the target level of the request, then the request is discarded and one response, if any, is forwarded to the second controller at a lower level.

DETAILED DESCRIPTION OF THE INVENTION

Figure 1:
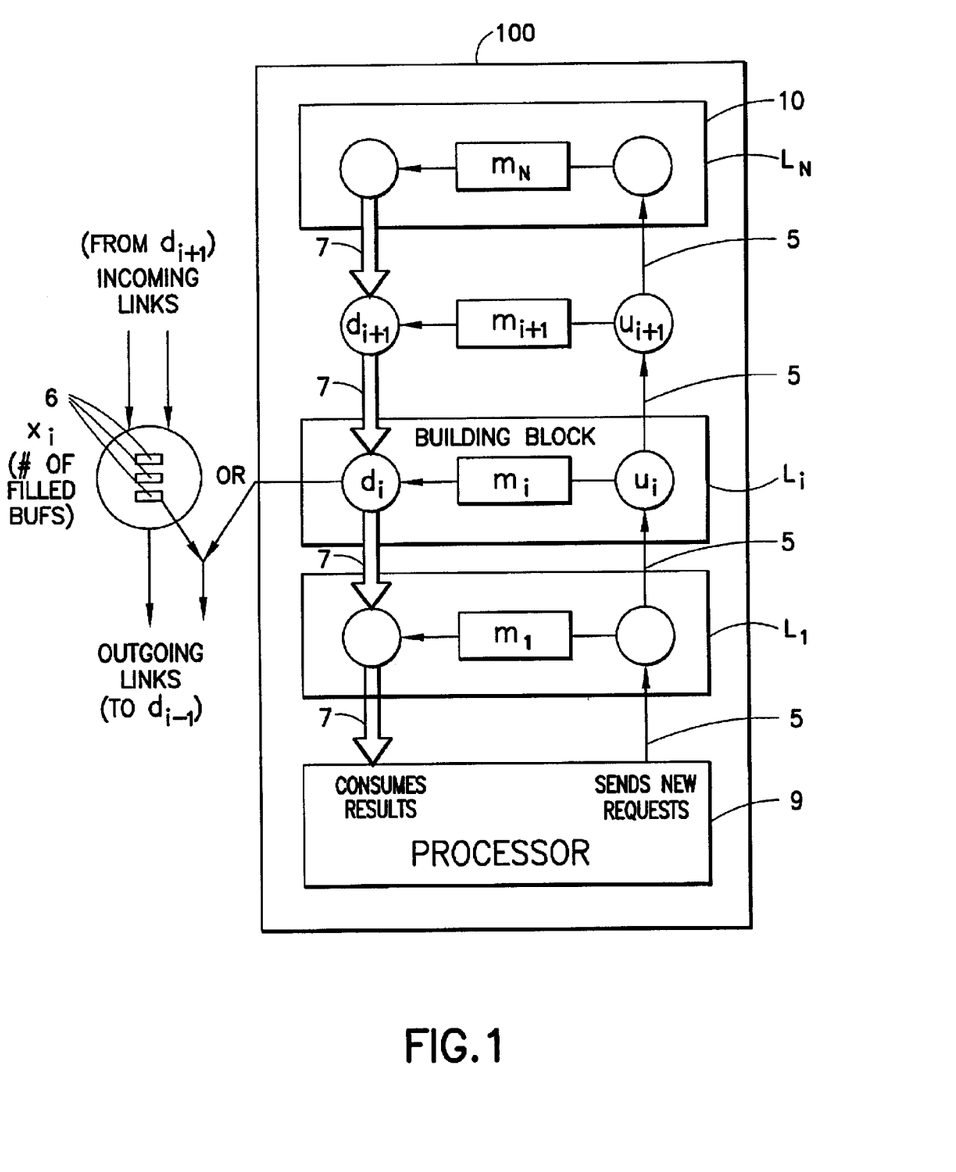
FIG. 1 illustrates the memory system in accordance with this invention.

The structure of the proposed memory system 10 is shown in FIG. 1. For ease of illustration, the system is shown to have a sequence of building blocks $L_1$ through $L_n$ laid out in one dimension. The blocks are numbered starting from $L_1$ at the processor and increasing as we go away from the processor. Each i-th building block $L_i$ has unit memory, denoted by $m_i$, and two controllers, $u_i$ and $d_i$. All the controllers $u_i$ are connected by single links 5 forming the "upward path" carrying requests from the processor to the memory cells. The controllers $d_i$ are connected by pairs of links 7 forming the "return path" and carry responses from memory cells to the processor. The design can sustain one request per unit time from the processor on the upward path, but the processor is required to be able to receive up to 2 responses in one unit time along the return path. Thus, this design requires an output bandwidth that is twice that of the input bandwidth. Also shown is a single processor 9 connected to this memory system. A processor such as that described in a related application, which is being filed concurrently with and by the assignee of the instant application, could be used with the memory system of this invention. The related application is IBM Docket YOR920010438US1, entitled: Scalable Processor, and is hereby incorporated herein by reference. A memory request specifies a target memory cell address, the operation (read/write) and data if it is a write operation. For a memory of size n, the target address is any integer between 1 and n. Any number greater than n can be used to simulate a no-operation (i.e. the processor did not submit any real request).

Requests and responses also carry additional information that is not interpreted by memory. For instance, if the processor executes an instruction of the form op(x,z) where x,z, are addresses of memory locations, the semantics is to perform the operation (op) on the data from location x of memory and to store the result into location z of memory. For this instruction, the memory request submitted is of the form [read, x, no-data, <op,z>]. The response to this request is of the form [read, x, data, <op,z>] where data is the information that was retrieved from location x. This response is forwarded on the return path through a series of second controllers to the processor. In the sample shown, when the response is received by the processor, the operation is performed on data to obtain a result, say w. Another request is then forwarded from processor through the first controllers on the upward path to store the result w at memory location z. The format of this request may look something like [write, z, w, no-info], which means store the value w at location z.

Figure 3:
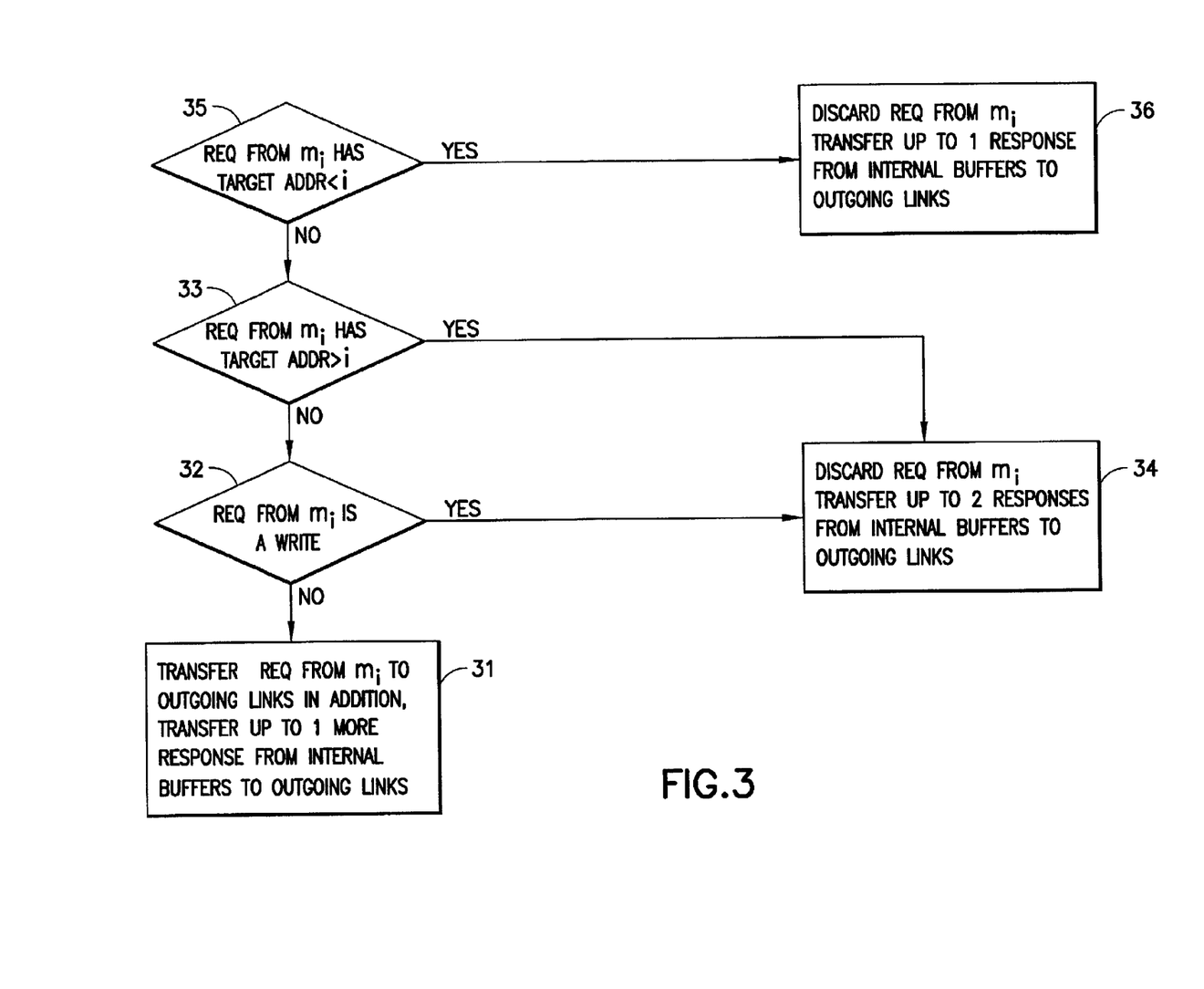
FIG. 3 is a flow chart illustrating the algorithm for the operation of the controller in forwarding responses to memory requests on the downward path of the memory system.

Each request with target address i travels on the upward path and a copy of it reaches the memory unit at every level. The memory unit $m_i$ reads or stores the data depending upon the operation and forwards it to the controller $d_i$. A write operation terminates here without generating any response, whereas a read operation causes the request to be converted into a response which travels along the return path until it reaches the processor. If we assume unit times to travel the communication links and unit time for reading the memory, a read request for target address i takes 2i+1 units of time in the absence of any congestion during its travel. The controllers are designed to deal with congestion and ensure the flow of requests or responses subject to the requirements stated in the preceding section. Referring to FIG. 3, the detailed logic for $u_i$, $m_i$ and $d_i$ are specified below:

Operation in Each Cycle:
 See FIG. 1.
 For each request received by $u_i$, one copy is sent to $m_i$ and another copy is sent to $u_{i+1}$. At the top (when i is n) the second copy is simply discarded.
 $m_i$ always forwards the request to $d_i$, after copying data from memory into request for a read operation, or copying data from request into memory for a write operation.

As shown in FIG. 1, $d_i$ has three internal buffers 6 which are organized as a FIFO queue. At the beginning of each cycle, $d_i$ transfers any responses to requests present on the 2 links from $d_{i+1}$ into its internal buffers. Then, the following algorithm (See flow chart in FIG. 3) is used to put responses on the two outgoing links to $d_{i-1}$:.
 1 If request from ml is a read to location i, then it is converted to a response and is placed on the outgoing link. In addition, one response from the internal buffers of $d_i$ (if any) is removed and placed on the outgoing links. (See 31 of FIG. 3.)
 2 If request from $m_i$ is a write to location i(32), or the request is targeted to a higher location, then up to two responses from the internal buffers of $d_i$ (if any) are removed and placed on the outgoing links (34).
 3 If request from $m_i$ is to a lower location (35), then 1 response from the internal buffers of $d_i$ (if any) is removed and placed on the outgoing links (36).

Figure 2:
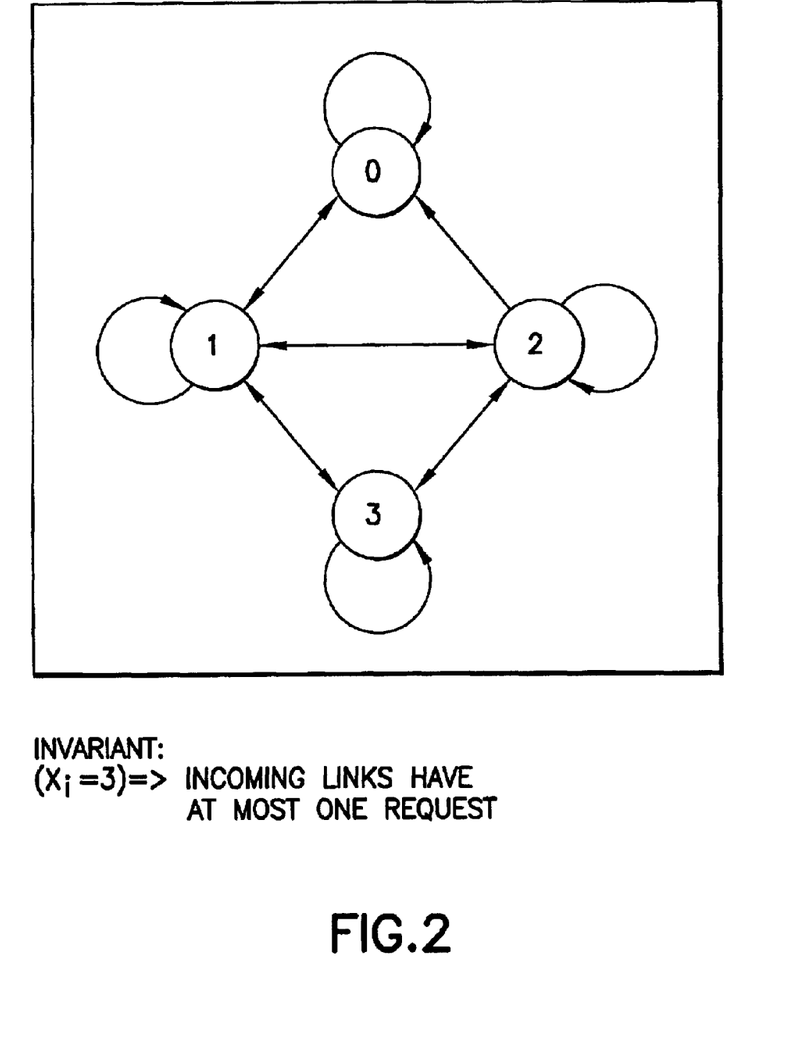
FIG. 2 graphically illustrates a state machine, where the states are defined by the buffer size of a controller which forwards responses along a downward path to the processor.

Properties of the Model:
 We now show the two properties required for scalability: constant buffer size in each unit and linear access latency:
 The size of the internal buffer of any $d_i$ will never exceed 3. FIG. 2 shows the possible transitions for $x_i$, which is the number of filled buffers in $d_i$ after each cycle. The invariant for the state $x_i=3$ asserts that in that state at most one response can come in through the incoming links and this ensures that $x_i$ will never exceed 3. To show the invariant, we examine the 2 possible transitions into the state $x_i=3$: Consider the first transition to state $x_i=3$. This transition occurs when initially $x_i=2$ and both the two incoming arcs on the link from $d_{i+1}$ (See 7 of FIG. 1.) carry responses and the request to $m_i$ is to location i or lower. This ensures that in the next cycle, there can be at most one response over the incoming arcs from $d_{i+1}$. This is because $m_{i+1}$ will process in the next cycle, a copy of the same response that $m_i$ processed in this cycle and hence $d_{i+1}$ will do case 3 of the above algorithm, outputting only one response. (See 35 and 36 of FIG. 3.) Now consider the second transition to state $x_i=3$. This transition occurs when initially $x_i=3$, there was one incoming request from $d_{i+1}$, and the request to m, is to location i or lower. This again ensures that in the next cycle, there can be at most one response over the incoming arcs from $d_{i+1}$.
 A read request to location i will return a corresponding response to the processor within 4i+1 cycles. The response to the read request reaches $d_i$ after i+1 cycles since its path length is i+1 and there are no delays on these paths. The controller $d_i$ immediately puts it on the outgoing arc as it executes case 1 of the algorithm. According to the algorithm, all buffers are emptied in FIFO order and at least one response from a buffer is removed in every cycle. Consequently, the response from d, can experience a maximum delay of 3i units before it reaches the processor. Hence the total delay is at most 4i+1 for forwarding a request on the upward path and the corresponding response on the return path to the processor.

We observe that the design preserves the order of memory operations at each location while the order of completion of operations on different locations is unspecified. The proposed memory system can be implemented using standard memory logic which is incorporated into memory chips.

Figure 4:
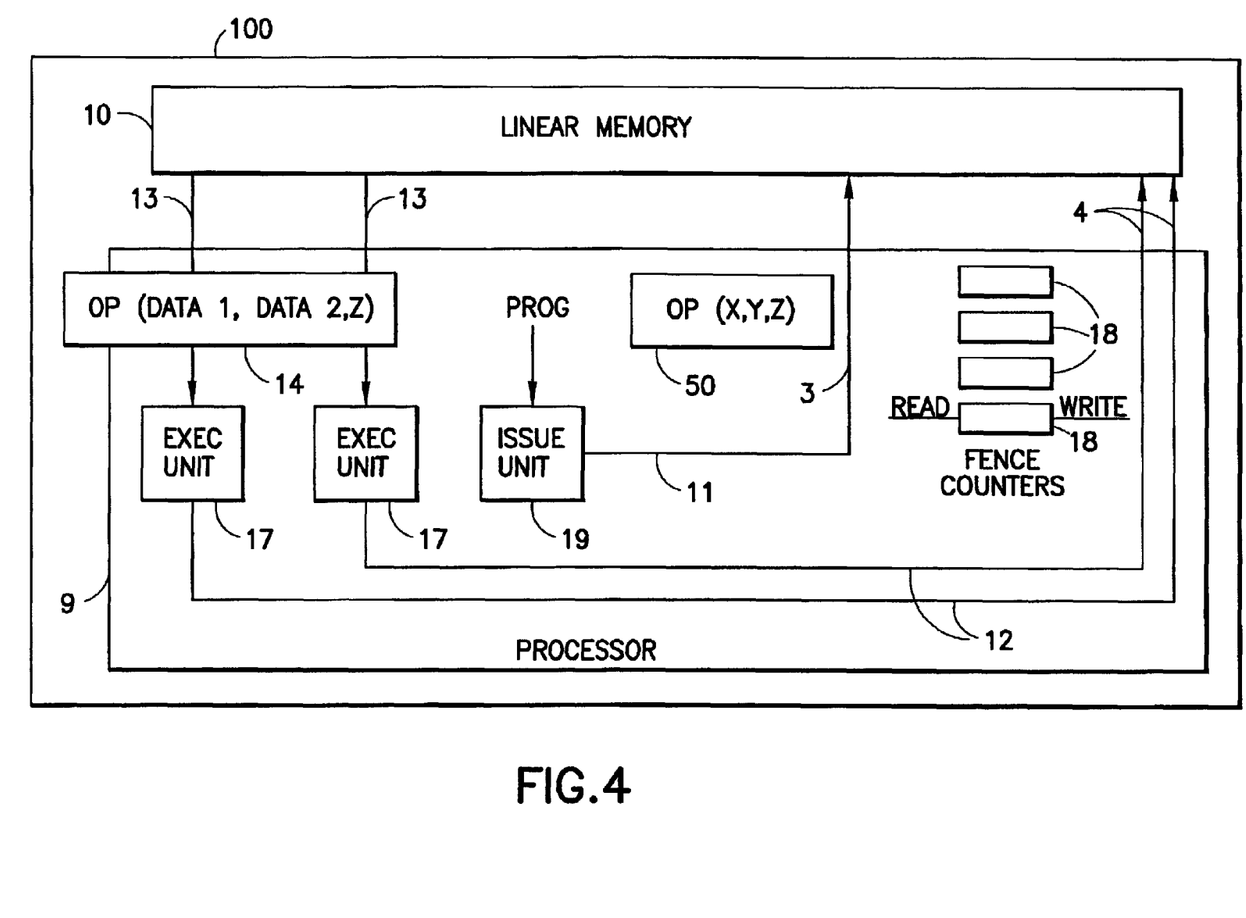
FIG. 4 graphically illustrates a processor that could be used with with the linear memory.

FIG. 4 illustrates the general scheme of the scalable processor system 100. It uses the linear memory 16. For convenience, we have extended the memory to have one port 3 for read requests and two ports 4 for write requests. This is done purely to match the linear memory 10 which can deliver two results in each cycle. Two execution units 17 consume these results 14 and submit write requests independently. The organization ensures that requests on these lines 12 do not interfere with each other.

The read request carries two target addresses x and y. It first travels to the earlier location, collects the data and travels further up on the upward path to the second location and collects the second piece of data. The result travels on the downward path 13 carrying the pair of data items requested.

Instruction Format:

The processor, will have no registers and uses a linear memory hierarchy for all its data—the lowest level representing registers. The general form of an instruction is op(x,y,z) where x,y,z are addresses of memory locations, and the semantics is to perform the operation (op) on the data from locations x and y and store the result into location z. The second operand may be omitted for unary operations. A unary instruction frequently used is the move(x,z) instruction, which copies the data from location x to location z.

Instruction Issue and Execution:

Referring to FIG. 4, a processor 9 consists of a single issue unit 19 that issues instructions 5 and two execution units 17, each of which can perform any operation when the data is available. Several issue and execution units can be implemented in hardware on a single hardware chip. An instruction goes through two phases: Issue phase and Execution phase. In the Issue phase, a dual-operand fetch is submitted to the linear memory 10. The op code and destination information are attached to the request and returned with the data. The execution phase starts when the memory returns the dual-operand data. Each execution unit receives operand data 14, performs an operation and submits a write request to the memory 10 to store the result. Instructions are issued in the same order in which they are listed in the program. Since the memory does not do any data movement other than what is specified by the instructions, the programs have full control of the memory and do the memory management explicitly by issuing move instructions to bring data closer to the processor as and when they are needed. The pipe lined nature of the memory facilitates concurrent movement of data while executing other instructions. Typically, using this invention, a programmer would use move instructions to bring data closer to the processor by the time the data is needed by the processor.

Figure 5:
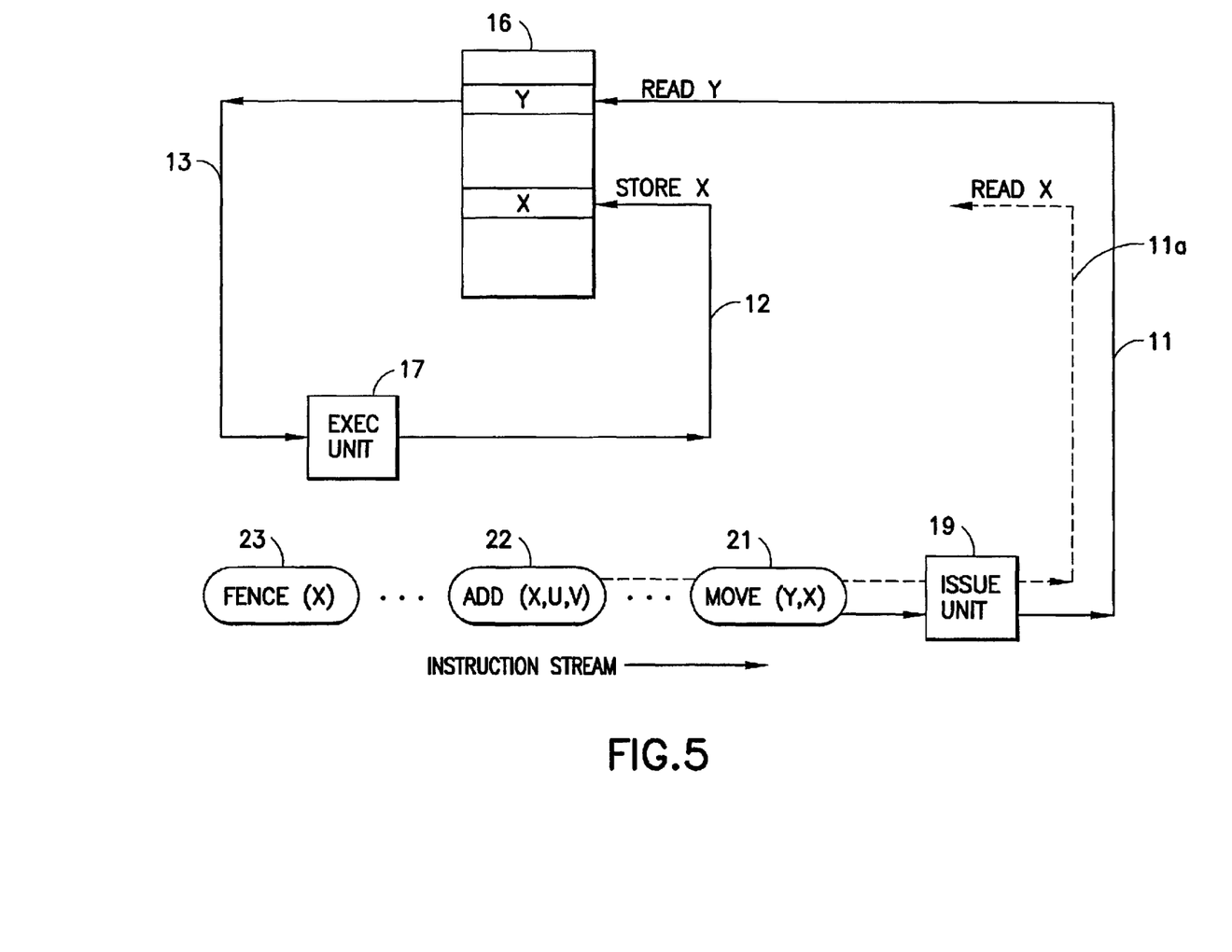
FIG. 5 graphically illustrates the read-write hazard.

Read-After-Write Hazards:

Since the Issue unit and the Execution units operate concurrently, one must ensure that a write operation to a location is submitted to the memory before a corresponding read operation to that location is submitted. See FIG. 2 for an illustration. For an instruction op(x,y,z), the write request to z is said to be outstanding during the time interval between issuing and executing that instruction. Hazards are avoided by keeping track of outstanding writes to regions of memory as described below. In FIG. 5, the path of solid lines illustrates how the move instruction 21 is executed. When it is issued, location y is read and the data flows into the execution unit 17. When it executes, the result is sent to be stored in location x. However, the issue unit proceeds concurrently and issues other instructions following it. The add instruction 22 is an example of a subsequent instruction that uses x and its path is illustrated by the dashed line 11a. If this add instruction is issued before the previous store to x takes place, we have a hazard.

Figure 6:
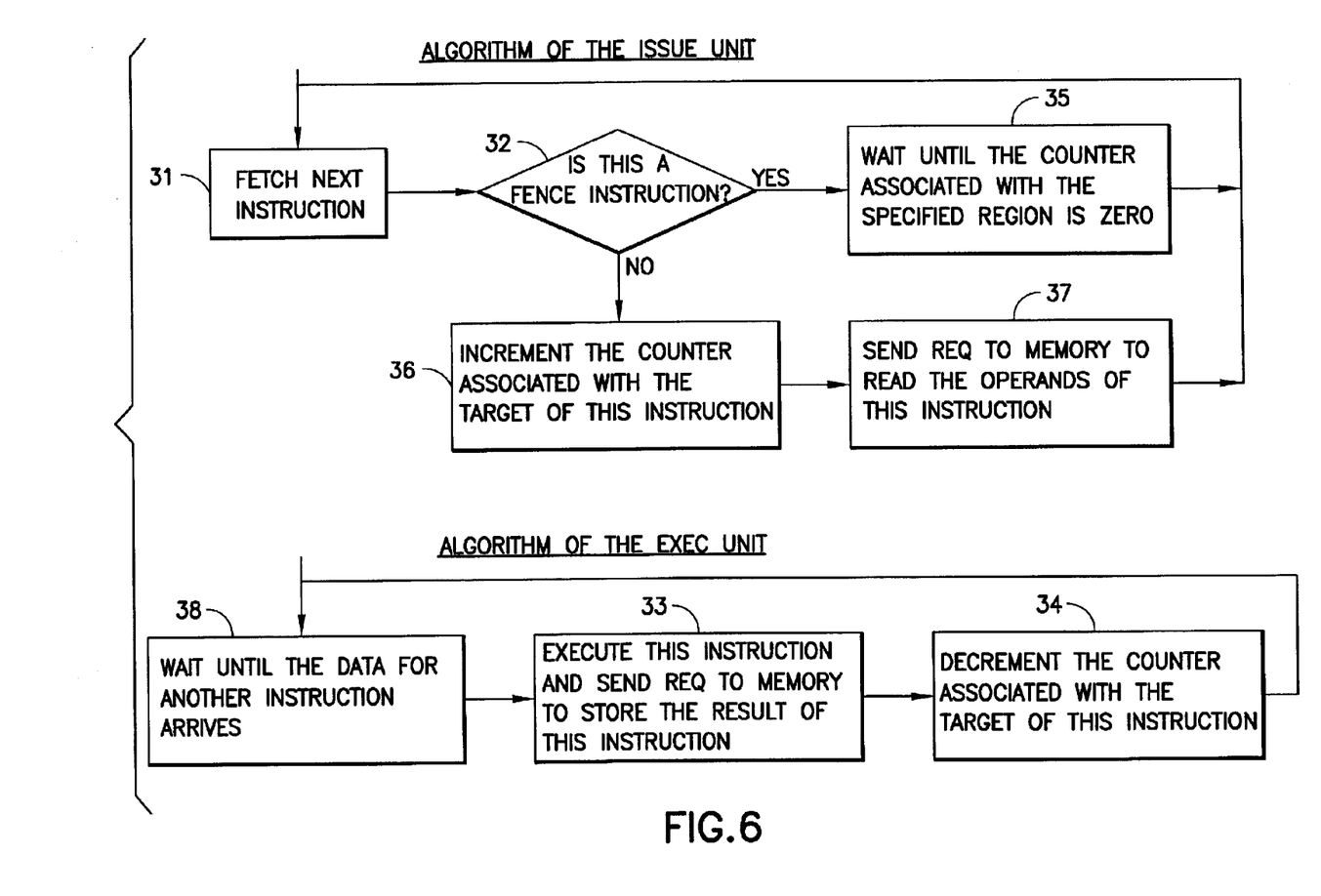
FIG. 6 includes flow charts for the operation of the issue and execution units of the processor.

Fence Counter:

The processor is equipped with a finite set of fence counters. Each fence counter is associated with a region of memory. By choosing the sizes of the regions as powers of 2, we need log N, and, thus, maintaining log N counters is not a serious limitation in practice. Referring to FIG. 6, each time an instruction such as op(x,y,z) is issued 31, the fence counter associated, with the range containing z is incremental 36, and a request is sent to memory to read the data at locations, for example, x and y. See 37 of FIG. 6. The data retrieved (data 1, data 2), for example, is then forwarded to the execution unit as shown in 38 of FIG. 6. When the execution unit completes that operation 33, i.e. op (data 1, data 2, z), and submits a write request to location z, 33, the corresponding fence counter (See 18 of FIG. 4) is decremented 34. Thus, the fence counter contains the number of outstanding writes to locations in its associated range. Fencing is accomplished explicitly by the program (a la release consistency model) by inserting a special instruction, in the form of: fence (region of memory), where appropriate. See 23 of FIG. 5. When a fence instruction is encountered by the issue unit 32, the issue unit stalls 35 until the corresponding fence counter becomes zero. This mechanism can be used by programs to avoid read-write hazards and can be made efficient by choosing the ranges and placement for the fence operations in a judicious manner. Typically, a counter is implemental in hardware.

The extreme case is to have every operation succeeded by a fence on its target location. While this works correctly, the execution is nearly sequential. A program can be organized to accumulate as many instructions as possible that write into a region and then a fence instruction is posted before accessing any location from that region. Compiler technology can be developed to judiciously choose the positions

Having thus described our invention, what we claim as new and desire to secure by Letters Patents is:

1. In a memory structure having a plurality of ordered memory levels, and forward and return paths for interconnecting said memory levels and a processor, each said memory level having a controller in said return path for receiving responses from an immediately higher one of said levels, if any, and for transmitting responses to an immediately lower one of said levels, except for the controller of the lowest one of said levels which transmits responses instead to said processor, each said controller having a buffer, a method of transferring requests from said processor on said forward path and responses to said requests on said return path to said processor, said method comprising the steps of:

transmitting each request from said processor to each of said levels;

if a request at any one of said levels is a read request addressed to the memory of said one level, then transmitting a response to said read request on said return path along with up to one other response from said buffer of said controller of said one level;

if a request at said any one of said levels is a write request addressed to the memory of said one level, then transmitting up to two responses from said buffer of said controller of said one level on said return path;

if a request at said any one of said levels is addressed to one of said levels higher than said one level, then transmitting up to two responses from said buffer of said controller of said one level on said return path; and if a request at said any one of said levels is addressed to one of said levels lower than said one level, then transmitting up to one response from said buffer of said controller of said one level on said return path.

2. A method as recited in claim 1, wherein at most thee responses are stored in said buffer of said controller of any of said memory levels.

3. A memory structure for receiving requests to and transmitting responses from a memory in said structure, said structure comprising:

an ordered set of memory levels, each memory level having a controller and a memory unit, said memory unit being a portion of said memory;

a forward path for transmitting said requests to said memory levels; and a return path for transmitting responses to said requests from any one of said levels which is higher than an immediately lower one of said levels to said immediately lower level;

wherein said controller of said one level transmits responses to said requests on said return path to a buffer in said controller of said immediately lower level in accordance with the following algorithm:

a. if a request at said one level is a read request addressed to said one level, then transmitting a response to said read request on said return path, along with up to one response from said buffer of said controller of said one level, to said buffer of said controller of said immediately lower level, b. if a request at said any one of said levels is a write request addressed to said one level, then transmitting no response to said write request on said return path and up to two responses from said buffer of said controller of said one level on said return path to said buffer of said controller of said immediately lower level, c. if a request at said any one of said levels is addressed to one of said levels higher than said one level, then transmitting up to two responses from said buffer of said controller of said one level on said return path to said buffer of said controller of said immediately lower level, and d. if a request at said any one of said levels is addressed to one of said levels lower than said one level, then transmitting up to one response from said buffer of said controller of said one level on said return path to said buffer of said controller of said immediately lower level.

4. A memory structure as recited in claim 3, wherein said buffer of each of said controllers stores at most three of said responses.

5. A memory structure as recited in claim 3, wherein said return path has twice the bandwidth of said forward path.

6. A memory structure as recited in claim 3, wherein each of said memory units has internal logic for copying data from said each memory unit to a request therefor, thereby forming a modified request, and for forwarding said modified request to controllers on said return path.

* * * * *